(12) United States Patent
Hyun et al.

(10) Patent No.: US 9,646,676 B1
(45) Date of Patent: May 9, 2017

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Sang Ah Hyun, Chungju-si (KR); Jeong Tae Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/057,843

(22) Filed: Mar. 1, 2016

(30) Foreign Application Priority Data

Dec. 9, 2015 (KR) ........................ 10-2015-0175454

(51) Int. Cl.
| | | |
|---|---|---|
| G11C 11/4094 | (2006.01) | |
| G11C 11/406 | (2006.01) | |
| G11C 11/4076 | (2006.01) | |
| G11C 11/4096 | (2006.01) | |
| G11C 11/4093 | (2006.01) | |

(52) U.S. Cl.
CPC ........ G11C 11/4094 (2013.01); G11C 11/406 (2013.01); G11C 11/4076 (2013.01); G11C 11/4093 (2013.01); G11C 11/4096 (2013.01)

(58) Field of Classification Search
CPC ..... G11C 29/14; G11C 11/401; G11C 7/1048; G11C 7/22
See application file for complete search history.

(56) References Cited

U.S. PATENT DOCUMENTS

| | | | | |
|---|---|---|---|---|
| 6,486,493 | B2 * | 11/2002 | Arimoto | G11C 29/48 365/201 |
| 2001/0040829 | A1 * | 11/2001 | Arimoto | G11C 29/48 365/189.02 |
| 2002/0001244 | A1 | 1/2002 | Ohtake | |
| 2002/0080677 | A1 * | 6/2002 | Watanabe | G11C 8/12 365/189.011 |
| 2002/0163850 | A1 * | 11/2002 | Song | G11C 7/22 365/233.1 |
| 2004/0184327 | A1 * | 9/2004 | Okuda | G11C 29/42 365/199 |
| 2005/0249020 | A1 * | 11/2005 | Kim | G11O 5/063 365/230.05 |
| 2009/0219775 | A1 * | 9/2009 | Hur | G11C 29/12 365/201 |

FOREIGN PATENT DOCUMENTS

KR 1020140029936 A 3/2014

* cited by examiner

*Primary Examiner* — Tuan T Nguyen
(74) *Attorney, Agent, or Firm* — William Park & Associates Ltd.

(57) ABSTRACT

A semiconductor system includes a first semiconductor device and a second semiconductor device. The first semiconductor device outputs commands, a test address, addresses and a precharge signal. The second semiconductor device enters an auto-precharge operation according to a combination of the commands after a read operation or a write operation and receives the test address and the precharge signal to perform an auto-precharge operation of one bank selected from a plurality of banks by the addresses.

26 Claims, 7 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2015-0175454, filed on Dec. 9, 2015, which is incorporated herein by reference in its entirety.

BACKGROUND

1. Technical Field

Embodiments of the invention relate to semiconductor devices controlling a precharge operation and semiconductor systems including the same.

2. Related Art

Semiconductor devices may receive or output data through input/output (I/O) lines. Signals of the I/O lines may be sensed and amplified during a read operation or a write operation, and the I/O lines may be precharged before commands are applied to the I/O lines. The term "precharge" means that signal lines such as the I/O lines are driven to a predetermined voltage level before data or signals are applied to the I/O lines in order to improve an operation speed of a semiconductor device while the data or the signals are inputted to or outputted from the semiconductor device. In addition, the precharging may include a precharge operation which is performed in accordance with an external precharge signal and an auto-precharge operation which is automatically performed after a command for a read operation or a write operation is inputted to a semiconductor device.

Meanwhile, the semiconductor device may receive data and a command (or a control signal) for controlling the input or output of the data from an external device to operate. In such a case, the semiconductor device is not able to output the data immediately at a point of time that a command for a read operation is inputted to the semiconductor device. That is, since an internal operation for outputting the data is performed in the semiconductor device after the command for the read operation is applied to the semiconductor device, a standby time may be required to output the data from the semiconductor device. Hence, the standby time extending from a point of time that the command (or a control signal) is applied to the semiconductor device till a point of time that the internal operation terminates is referred to as "latency".

For example, the latency, which is defined in the specification for semiconductor devices, may include column address strobe (CAS) latency (CL), CAS write latency (CWL) and additive latency (AL). The CL may correspond to a standby time (or a time interval) from a moment that a read command is applied to a semiconductor device till a moment that data are outputted from the semiconductor device through data pins. The CWL may correspond to a standby time (or a time interval) from a moment that a write command is applied to a semiconductor device till a moment that data corresponding to the write command are inputted to the semiconductor device. The AL may correspond to a standby time (or a time interval) from a moment that a row address is inputted to a semiconductor device till a moment that a column address is inputted to the semiconductor device during a read operation or a write operation.

The latencies may be stored in a mode register set (MRS) included in a semiconductor device, and the semiconductor device may operate based on information on the latencies which are stored in the MRS.

SUMMARY

According to an embodiment, a semiconductor system includes a first semiconductor device and a second semiconductor device. The first semiconductor device outputs commands, a test address, addresses and a precharge signal. The second semiconductor device enters an auto-precharge operation according to a combination of the commands after a read operation or a write operation and receives the test address and the precharge signal to perform a precharge operation of one bank selected from a plurality of banks by the addresses.

According to an embodiment, The semiconductor system include a precharge control circuit configured to generate first to eighth auto-precharge signals, wherein one of the first to eighth auto-precharge signals is selectively enabled according to a combination of bank addresses.

According to an embodiment, wherein the pre-charge control circuit generates first to eighth internal precharge signals, wherein one of the first to eighth internal precharge signals is selectively enabled according to first to eighth auto-precharge signals.

According to an embodiment, wherein one of the first to eighth internal precharge signals is selectively enabled according to a combination of first to eighth flag signals.

According to an embodiment, wherein the pre-charge control circuit generates the first to eight auto-precharge signals according to a test signal.

According to an embodiment, wherein one of the first to eighth auto-precharge signals is selectively enabled in response to a read signal or a write signal.

According to an embodiment, where the precharge control circuit is configured to generate first to eighth delay signals, wherein one of the first to eight delay signals is selective enabled according to the combination of bank addresses.

According to an embodiment, wherein the first precharge control circuit generates first to eighth internal precharge signals, wherein the first to eighth internal precharge signals are enabled according to first to eighth flag signals and first to eighth delay signals.

According to an embodiment, wherein the precharge control circuit is configured to delay the combination of bank addresses by a delay time to generate first to eighth shifting addresses.

According to an embodiment, wherein the delay time is a standby time from when a row address is inputted to when a column address is inputted during the read operation or the write operation.

According to an embodiment, wherein the precharge control circuit generates first to eighth preaddresses according to the first to eight shifting addresses.

According to an embodiment, wherein the precharge control circuit is configured to generate first to eighth inverted precharge signals according to the combination of bank addresses.

According to an embodiment, wherein the precharge control circuit is configured to generate first to eighth delay signals, wherein one of the first to eighth delay signals is selectively enabled according to the first to eighth inverted precharge signals.

According to an embodiment, wherein the first to eighth delay signals are sequentially enabled according to first to eighth refresh signals.

According to an embodiment, wherein the precharge control circuit is configured to output first to eighth read addresses as the first to eighth auto-precharge signals in synchronization with a read pulse signal.

According to an embodiment, wherein the precharge control circuit is configured to output first to eighth write addresses as the first to eighth auto-precharge signals in synchronization with a write pulse signal.

According to an embodiment, a semiconductor device includes a precharge control circuit, a flag signal generation circuit and an internal circuit. The precharge control circuit is suitable for generating auto-precharge signals, one of which is selectively enabled according to a combination of bank addresses in an auto-precharge operation which is executed after a read operation or a write operation. In addition, the precharge control circuit is suitable for generating internal precharge signals, one of which is selectively enabled according to a combination of flag signals in response to a precharge signal. The flag signal generation circuit is suitable for generating the flag signals, one of which is selectively enabled according to a combination of the bank addresses if a test signal is enabled in the auto-precharge operation. The internal circuit includes a plurality of banks. The internal circuit is suitable for precharging one bank selected from the plurality of banks in response to the internal precharge signals in the auto-precharge operation.

According to an embodiment, a semiconductor device includes a read/write control circuit, a precharge control circuit, a flag signal generation circuit and an internal circuit. The read/write control circuit is suitable for generating a read signal which is enabled if a read operation is executed according to a combination of commands. Moreover, the read/write control circuit is suitable for generating a write signal which is enabled if a write operation is executed according to the combination of the commands. The precharge control circuit is suitable for generating auto-precharge signals, one of which is selectively enabled according to a combination of bank addresses in response to a test signal and any one of the read signal and the write signal. In addition, the precharge control circuit is suitable for generating internal precharge signals, one of which is selectively enabled according to a combination of flag signals in response to a precharge signal. The flag signal generation circuit is suitable for generating the flag signals, one of which is selectively enabled according to the combination of the bank addresses in response to the read signal or the write signal if the test signal is enabled. The internal circuit is suitable for including a plurality of banks, one of which is selected by the bank addresses in response to the read signal or the write signal. Moreover, the internal circuit is suitable for precharging the selected bank in response to the internal precharge signals after the read operation or the write operation of the selected bank.

DETAILED DESCRIPTION

Various embodiments of the invention will be described hereinafter with reference to the accompanying figures. However, the embodiments described herein are for illustrative purposes only and are not intended to limit the scope of the invention. Various embodiments are directed to semiconductor devices controlling a precharging operation and semiconductor systems including the same.

Figure 1:
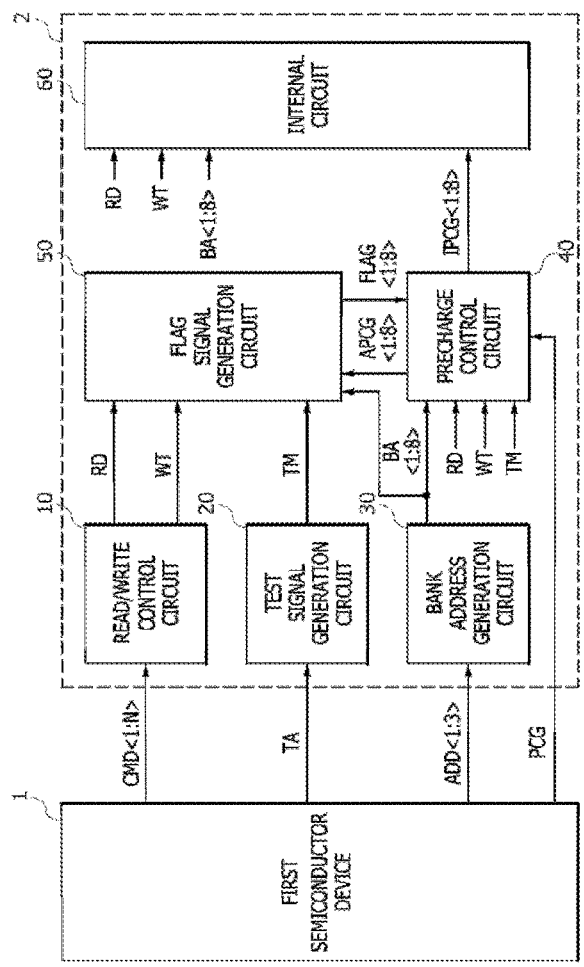
FIG. 1 is a block diagram illustrating a configuration of a semiconductor system according to an embodiment of the invention.

Referring to FIG. 1, a semiconductor system according to an embodiment of the invention may include a first semiconductor device 1 and a second semiconductor device 2. The second semiconductor device 2 may include a read/write control circuit 10, a test signal generation circuit 20, a bank address generation circuit 30, a precharge control circuit 40, a flag signal generation circuit 50, and an internal circuit 60. The internal components of the semiconductor system may be configured as circuits or the like.

The first semiconductor device 1 may output commands CMD<1:N>, a test address TA, first to third addresses ADD<1:3>, and a precharge signal PCG.

The read/write control circuit 10 may decode the commands CMD<1:N> to generate a read signal RD and a write signal WT. If the commands CMD<1:N> have a combination for a read operation, the read/write control circuit 10 may generate the read signal RD which is enabled. If the commands CMD<1:N> have a combination for a write operation, the read/write control circuit 10 may generate the write signal WT which is enabled. The read/write control circuit 10 may generate the read signal RD enabled during a read operation and the write signal WT enabled during a write operation using some bits of the commands CMD<1:N>. The commands CMD<1:N> may be transmitted through lines that transmit at least one group of addresses, commands, and data. In addition, the commands CMD<1:N> may be continuously transmitted through one line. The number of bits of the commands CMD<1:N> may be set to be different according to various embodiments.

The test signal generation circuit 20 may generate a test signal TM which is enabled in response to the test address TA. The test address TA may be enabled to enter an auto-precharge operation for executing a precharge operation after a predetermined section from a point of time that the semiconductor device enters a read operation mode or a write operation mode. The test address TA may be inputted through any one of lines that transmit at least one group of addresses, commands, and data.

The bank address generation circuit 30 may decode the first to third addresses ADD<1:3> to generate first to eighth bank addresses BA<1:8>. In an embodiment, the first to third addresses ADD<1:3> are set to have three bits. However, in various embodiments, the number of bits of the first to third addresses ADD<1:3> may be set to be less than or greater than three. In addition, the first to third addresses ADD<1:3> may be transmitted through lines that transmit at least one group of addresses, commands, and data.

The precharge control circuit 40 may receive the read signal RD, the write signal WT and the test signal TM to generate first to eighth auto-precharge signals APCG<1:8>, one of which is selectively enabled according to a combination of the first to eighth bank addresses BA<1:8> during an auto-precharge operation executed after a read operation or a write operation. The precharge control circuit 40 may generate first to eighth internal precharge signals IPCG<1:8>, one of which is selectively enabled in accordance with the first to eighth auto-precharge signals APCG<1:8>. The precharge control circuit 40 may generate the first to eighth internal precharge signals IPCG<1:8>, one of which is selectively enabled in accordance with a combination of first to eighth flag signals FLAG<1:8> in response to the precharge signal PCG.

The flag signal generation circuit 50 may generate the first to eighth flag signals FLAG<1:8>, one of which is selectively enabled in accordance with a combination of the first to eighth bank addresses BA<1:8> during the auto-precharge operation in response to the read signal RD, the write signal WT and the test signal TM.

The internal circuit 60 may include first to eighth banks (not illustrated), one of which is selected in accordance with a combination of the first to eighth bank addresses BA<1:8>. The internal circuit 60 may perform a read operation of one of the first to eighth banks, which is selected in accordance with a combination of the first to eighth bank addresses BA<1:8> in response to the read signal RD. The internal circuit 60 may perform a write operation of one of the first to eighth banks, which is selected in accordance with a combination of the first to eighth bank addresses BA<1:8> in response to the write signal WT. The internal circuit 60 may precharge one of the banks, which is selected in response to the first to eighth internal precharge signals IPCG<1:8>. The first to eighth bank addresses BA<1:8> may be set to correspond to first to eighth banks, respectively. Similarly, the first to eighth internal precharge signals IPCG<1:8> may also be set to correspond to first to eighth banks, respectively. For example, if the first bank address BA<1> and the first internal precharge signal IPCG<1> are enabled, the first bank may be selected and a read operation or a write operation of the first bank may be performed together with a precharge operation.

Figure 2:
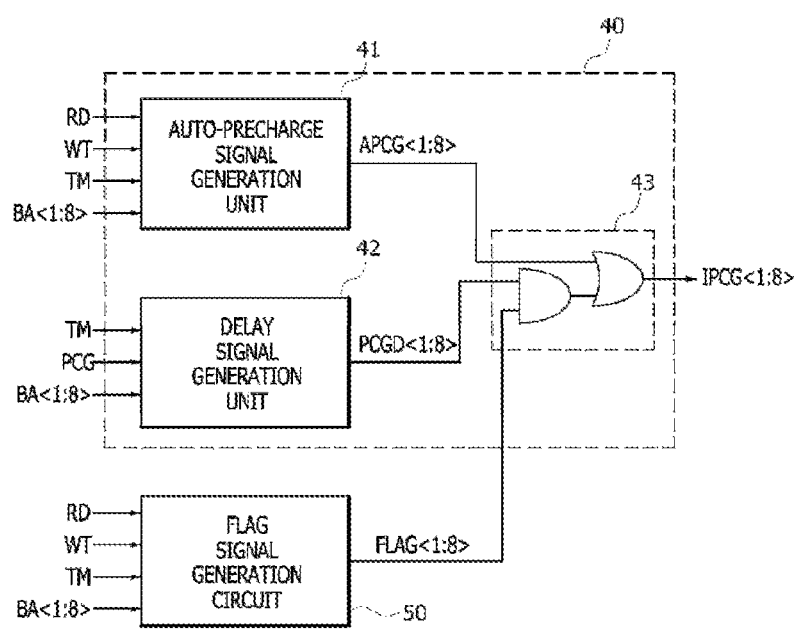
FIG. 2 is a block diagram illustrating a configuration of a precharge control circuit and a flag signal generation circuit included in the semiconductor system of FIG. 1.

Referring to FIG. 2, the precharge control circuit 40 may include an auto-precharge signal generation unit 41, a delay signal generation unit 42 and an internal precharge signal generation unit 43.

The auto-precharge signal generation unit 41 may receive the test signal TM to generate the first to eighth auto-precharge signals APCG<1:8>, one of which is selectively enabled in accordance with a combination of the first to eighth bank addresses BA<1:8> after a predetermined section from a point of time that the read signal RD or the write signal WT is inputted to auto-precharge signal generation unit 41.

The delay signal generation unit 42 may generate first to eighth delay signals PCGD<1:8>, one of which is selectively enabled in accordance with a combination of the first to eighth bank addresses BA<1:8>, in response to the test signal TM and the precharge signal PCG.

The internal precharge signal generation unit 43 may generate the first to eighth internal precharge signals IPCG<1:8> which are enabled if the first to eighth auto-precharge signals APCG<1:8> are enabled. The internal precharge signal generation unit 43 may generate the first to eighth internal precharge signals IPCG<1:8> which are enabled if the first to eighth flag signals FLAG<1:8> and the first to eighth delay signals PCGD<1:8> are enabled.

The flag signal generation circuit 50 may generate the first to eighth flag signals FLAG<1:8>, one of which is selectively enabled in accordance with a combination of the first to eighth bank addresses BA<1:8> during an auto-precharge operation, in response to the read signal RD, the write signal WT and the test signal TM. An internal configuration of the flag signal generation circuit 50 will be described in detail with reference to FIG. 5 later.

Figure 3:
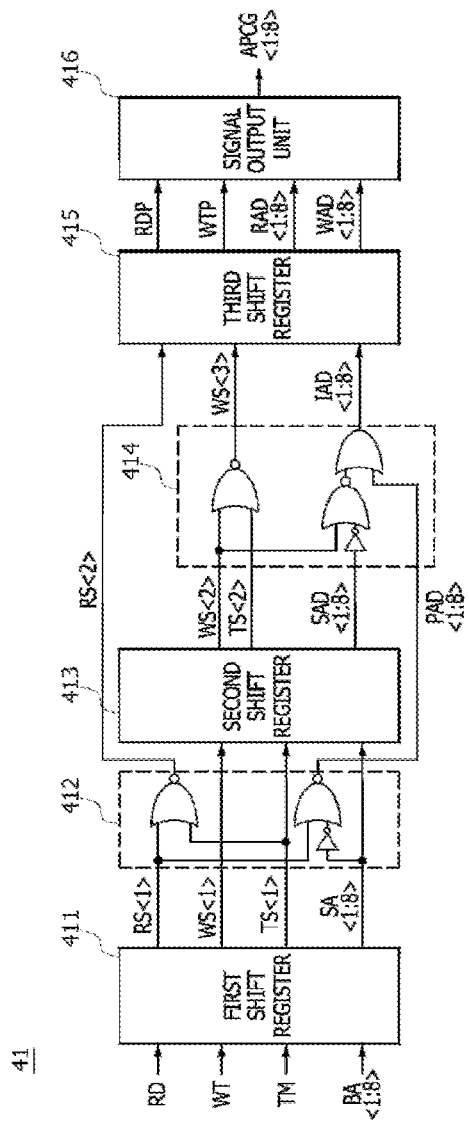
FIG. 3 is a block diagram illustrating a configuration of an auto-precharge signal generation unit included in the precharge control circuit of FIG. 2.

Referring to FIG. 3, the auto-precharge signal generation unit 41 may include a first shift register 411, a first logic unit 412, a second shift register 413, a second logic unit 414, a third shift register 415 and a signal output unit 416.

The first shift register 411 may delay the read signal RD, the write signal WT, the test signal TM and the first to eighth bank addresses BA<1:8> by a first delay time to generate a first read shifting signal RS<1>, a first write shifting signal WS<1>, a first test shifting signal TS<1> and first to eighth shifting addresses SA<1:8>. The first delay time may be set to correspond to an additive latency (AL), that is, a standby time from a moment that a row address is inputted to the semiconductor device till a moment that a column address is inputted to the semiconductor device during a read operation or a write operation. The row address and the column address may be used to select one of more memory cells included in a bank. The first shift register 411 may be realized using a plurality of flip-flops.

The first logic unit 412 may inversely buffer the first read shifting signal RS<1> in response to the first test shifting signal TS<1> to generate a second read shifting signal RS<2>. The first logic unit 412 may buffer the first to eighth shifting addresses SA<1:8> in response to the first read shifting signal RS<1> to generate first to eighth preaddresses PAD<1:8>.

The second shift register 413 may delay the first write shifting signal WS<1>, the first test shifting signal TS<1> and the first to eighth shifting addresses SA<1:8> by a second delay time to generate a second write shifting signal WS<2>, a second test shifting signal TS<2> and first to eighth delay addresses SAD<1:8>. The second delay time may be set to correspond to a CAS write latency (CWL), that is, a standby time from a moment that a write command is applied to a semiconductor device till a moment that data corresponding to the write command are inputted to the semiconductor device. The second shift register 413 may be realized using a plurality of flip-flops.

The second logic unit 414 may inversely buffer the second write shifting signal WS<2> in response to the second test shifting signal TS<2> to generate a third write shifting signal WS<3>. The second logic unit 414 may output the first to eighth preaddresses PAD<1:8> as first to eighth internal addresses IAD<1:8>. The second logic unit 414 may buffer the first to eighth delay addresses SAD<1:8> in response to the second write shifting signal WS<2> to generate the first to eighth internal addresses IAD<1:8>.

The third shift register 415 may delay the second read shifting signal RS<2> and the third write shifting signal WS<3> by a third delay time to generate a read pulse signal RDP and a write pulse signal WTP. The third shift register 415 may delay the first to eighth internal addresses IAD<1:8> by the third delay time in response to the second read shifting signal RS<2> to generate first to eighth read addresses RAD<1:8>. The third shift register 415 may delay the first to eighth internal addresses IAD<1:8> by the third delay time in response to the third write shifting signal WS<3> to generate first to eighth write addresses WAD<1:8>. The third delay time may be set to be a read to precharge time (tRTP) corresponding to a standby time from a moment that a command for a read operation is inputted till a moment that a precharge signal is applied and a write recovery time (tWR) corresponding to a standby time from a moment that a command for a write operation is inputted till a moment that a precharge signal is applied. The third shift register 415 may be realized using a plurality of flip-flops.

The signal output unit 416 may output the first to eighth read addresses RAD<1:8> as the first to eighth auto-precharge signals APCG<1:8> in synchronization with the read pulse signal RDP. The signal output unit 416 may output the first to eighth write addresses WAD<1:8> as the first to eighth auto-precharge signals APCG<1:8> in synchronization with the write pulse signal WTP. A delay time of the read signal RD for generating the read pulse signal RDP may be set to be a sum of the first delay time and the third delay time. A delay time of the write signal WT for generating the write pulse signal WTP may be set to be a sum of the first, second and third delay times.

Figure 4:
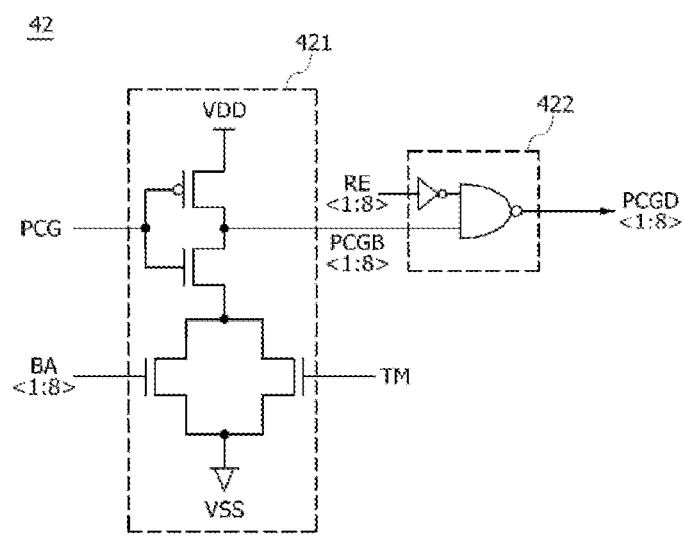
FIG. 4 is a circuit diagram illustrating a configuration of a delay signal generation unit included in the precharge control circuit of FIG. 2.

Referring to FIG. 4, the delay signal generation unit 42 may include a drive unit 421 and a delay signal output unit 422.

The drive unit 421 may inversely buffer the precharge signal PCG in response to the test signal TM and the first to eighth bank addresses BA<1:8> to generate first to eighth inverted precharge signals PCGB<1:8>. In FIG. 4, the drive unit 421 is illustrated using a single drive unit. However, the drive unit 421 may be actually configured to include first to eighth drive units that correspond to the first to eighth bank addresses BA<1:8> respectively. In such a case, the first to eighth drive units may generate the first to eighth inverted precharge signals PCGB<1:8>, respectively. FIG. 4 also illustrates a ground supply voltage VSS and a power supply voltage VDD.

The delay signal output unit 422 may generate the first to eighth delay signals PCGD<1:8>, one of which is selectively enabled, in response to the first to eighth inverted precharge signals PCGB<1:8>. The delay signal output unit 422 may generate the first to eighth delay signals PCGD<1:8> which are sequentially enabled in response to first to eighth refresh signals RE<1:8> that are sequentially enabled during a refresh operation. In FIG. 4, the delay signal output unit 422 is illustrated using a single output unit. However, the delay signal output unit 422 may be actually configured to include first to eighth delay signal output units that correspond to the first to eighth refresh signals RE<1:8> respectively. In such a case, the first to eighth delay signal output units may generate the first to eighth delay signals PCGD<1:8>, respectively.

Figure 5:
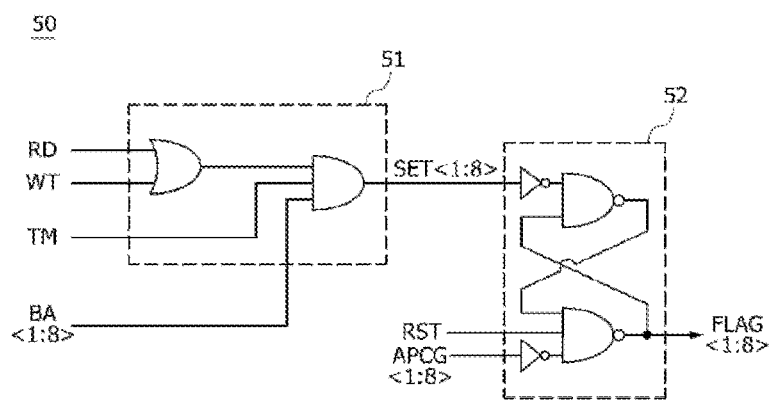
FIG. 5 is a circuit diagram illustrating a configuration of the flag signal generation circuit included in the semiconductor system of FIG. 1.

Referring to FIG. 5, the flag signal generation circuit 50 may include a setting signal generation unit 51 and a flag signal generation unit 52.

The setting signal generation unit 51 may generate first to eighth setting signals SET<1:8>, one of which is selectively enabled in accordance with a combination of the first to eighth bank addresses BA<1:8>, in response to the read signal RD, the write signal WT and the test signal TM. If the read signal RD or the write signal WT inputted to the setting signal generation unit 51 has a logic high level and the test signal TM inputted to the setting signal generation unit 51 has a logic high level, the setting signal generation unit 51 may generate the first to eighth setting signals SET<1:8>, one of which is selectively enabled in accordance with a combination of the first to eighth bank addresses BA<1:8>. In FIG. 5, the setting signal generation unit 51 is illustrated using a single setting signal generation unit. However, the setting signal generation unit 51 may be actually configured to include first to eighth setting signal generation units that correspond to the first to eighth bank addresses BA<1:8> respectively. In such a case, the first to eighth setting signal generation units may generate the first to eighth setting signals SET<1:8>, respectively.

The flag signal generation unit 52 may generate the first to eighth flag signals FLAG<1:8> which are enabled if the first to eighth setting signals SET<1:8> are enabled and which are disabled if a reset signal RST and the first to eighth auto-precharge signals APCG<1:8> are disabled. In FIG. 5, the flag signal generation unit 52 is illustrated using a single flag signal generation unit. However, the flag signal generation unit 52 may be actually configured to include first to eighth flag signal generation units that correspond to the first to eighth auto-precharge signals APCG<1:8> respectively. In such a case, the first to eighth flag signal generation units may generate the first to eighth flag signals FLAG<1:8>, respectively. The flag signal generation unit 52 may be realized using a general SR latch circuit.

Figure 6:
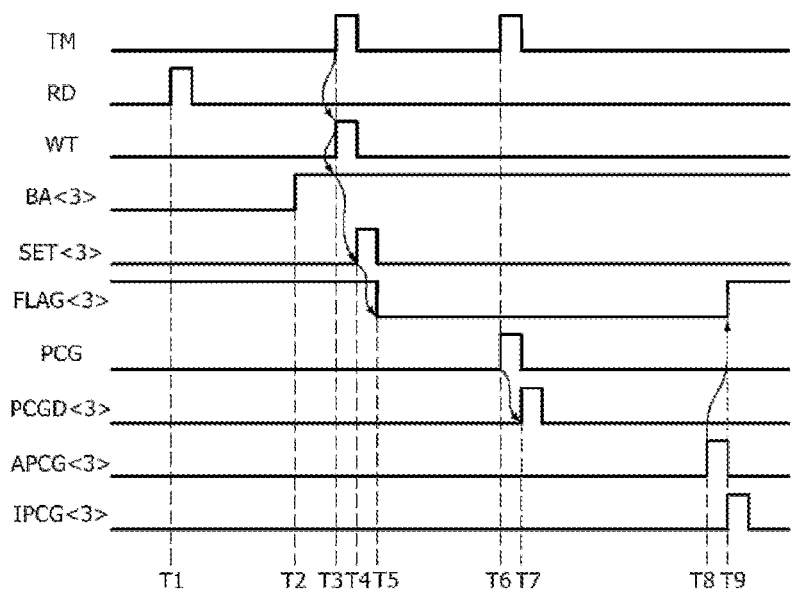
FIG. 6 is a timing diagram illustrating an operation of the semiconductor system according to an embodiment of the invention.

An operation of the semiconductor system having the aforementioned configuration will be described hereinafter with reference to FIG. 6 in conjunction with an example in which the precharge signal is inputted to the semiconductor device during a write operation of a third bank in an auto-precharge operation after a read operation and a write operation.

At a point of time T1, the first semiconductor device 1 may output the commands CMD<1:N> for activating the read operation.

The read/write control circuit 10 may decode the commands CMD<1:N> to generate the read signal RD which is enabled to have a logic high level.

The internal circuit 60 may perform the read operation in response to the read signal RD.

At a point of time T2, the first semiconductor device 1 may output the first to third addresses ADD<1:3> for generating the third bank address BA<3>.

The bank address generation circuit 30 may decode the first to third addresses ADD<1:3> to generate the third bank address BA<3> having a logic high level.

At a point of time T3, the first semiconductor device 1 may output the commands CMD<1:N> and the test address TA for activating the write operation and the auto-precharge operation.

The read/write control circuit 10 may decode the commands CMD<1:N> to generate the write signal WT which is enabled to have a logic high level.

The test signal generation circuit 20 may generate the test signal TM which is enabled to have a logic high level in response to the test address TA.

The internal circuit 60 may receive the write signal WT and the third bank address BA<3> to performs a precharge operation after a write operation of the third bank (not illustrated). After the write operation of the third bank (not illustrated) terminates, the auto-precharge operation executing the precharge operation may be performed.

At a point of time T4, the setting signal generation unit 51 of the flag signal generation circuit 50 may generate the third setting signal SET<3> having a logic high level in response to the write signal WT generated to have a logic high level at the point of time T3, the test signal TM generated to have a logic high level at the point of time T3, and the third bank address BA<3> having a logic high level.

At a point of time T5, the flag signal generation unit 52 of the flag signal generation circuit 50 may generate the third flag signal FLAG<3> having a logic low level in response to the third setting signal SET<3> generated to have a logic high level at the point of time T4.

At a point of time T6, the first semiconductor device 1 may generate the test address TA and the precharge signal PCG for precharge operations of all of the banks.

The test signal generation circuit 20 may generate the test signal TM which is enabled to have a logic high level in response to the test address TA.

The drive unit 421 of the delay signal generation unit 42 may generate the third inverted precharge signal PCGB<3> having a logic low level in response to the test signal TM having a logic high level, the third bank address BA<3> having a logic high level, and the precharge signal PCG having a logic high level. In such a case, the first and second inverted precharge signals PCGB<1:2>, and the fourth to eighth inverted precharge signals PCGB<4:8> may be generated to have a logic high level.

At a point of time T7, the delay signal output unit 422 of the delay signal generation unit 42 may generate the third delay signal PCGD<3> having a logic high level in response to the third inverted precharge signal PCGB<3> having a logic low level. In such a case, the first and second delay signals PCGD<1:2> and the fourth to eighth delay signals PCGD<4:8> may be generated to have a logic high level.

The internal precharge signal generation unit 43 may receive the third delay signal PCGD<3> having a logic high level and the third flag signal FLAG<3> having a logic low level to generate the third internal precharge signal IPCG<3> having a logic low level. In such a case, the first and second internal precharge signals IPCG<1:2> and the fourth to eighth internal precharge signals IPCG<4:8> may be generated to have a logic high level.

The third bank of the internal circuit 60 may receive the third internal precharge signal IPCG<3> having a logic low level and may not perform the precharge operation executed by the precharge signal PCG. In more detail, the third bank of the internal circuit 60 may perform the auto-precharge operation after a predetermined section from a point of time that the write operation starts.

The first and second banks of the internal circuit 60 may receive the first and second internal precharge signals IPCG<1:2> having a logic high level and perform the precharge operation. The fourth to eighth banks of the internal circuit 60 may receive the fourth to eighth internal precharge signals IPCG<4:8> and perform the precharge operation. The first and second banks and the fourth to eighth banks of the internal circuit 60 may perform the precharge operation in accordance with the precharge signal PCG.

At a point of time T8, the auto-precharge signal generation unit 41 may generate the third auto-precharge signals APCG<3> having a logic high level. The point of time T8 may be a point of time that a standby time corresponding to the sum of the first delay time (the additive latency: AL), the second delay time (the CAS write latency: CWL) and the third delay time (the write recovery time: tWR) elapses from the point of time T3 that the write operation is executed.

At a point of time T9, the flag signal generation circuit 50 may generate the third flag signal FLAG<3> having a logic high level in response to the third auto-precharge signals APCG<3> which is generated to have a logic high level at the point of time T8.

Subsequently, if the first semiconductor device 1 outputs the precharge signal PCG, all of the first to eighth banks of the internal circuit 60 may perform the precharge operation.

As described above, the semiconductor system according to an embodiment may execute an auto-precharge operation of a selected bank after a read operation or a write operation of the selected bank and may execute the auto-precharge operation of the remaining banks in response to a precharge signal supplied from an external device. In addition, if the read operation or the write operation of the selected bank is completed during the auto-precharge operation executed after the read operation or the write operation, the semiconductor system may precharge all of the banks in response to the precharge signal supplied from the external device.

Figure 7:
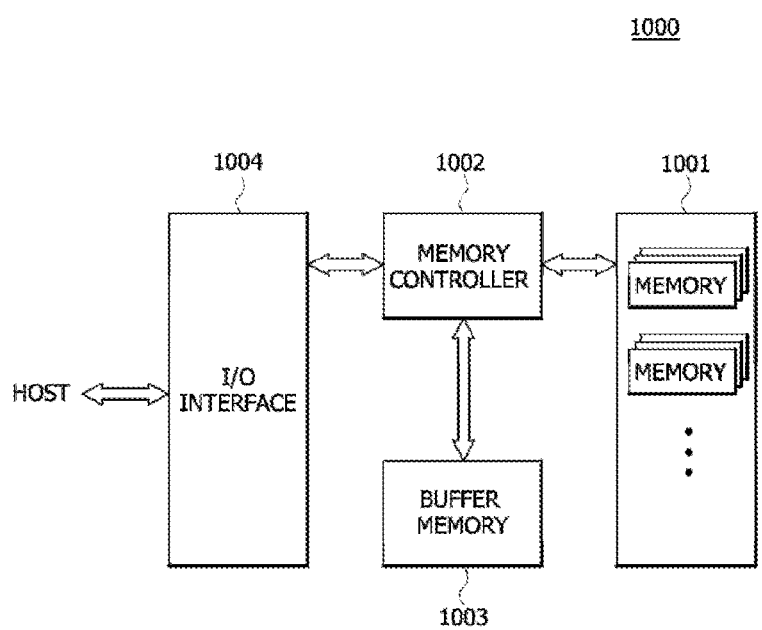
FIG. 7 is a block diagram illustrating a configuration of an electronic system employing the semiconductor device or the semiconductor system shown in FIG. 1 to FIG. 6.

The second semiconductor device or the semiconductor system described with reference to FIGS. 1 to 6 may be applied to an electronic system that includes a memory system, a graphic system, a computing system, a mobile system, or the like. For example, as illustrated in FIG. 7, an electronic system 1000 according an embodiment may include a data storage unit 1001, a memory controller 1002, a buffer memory 1003, and an input/output (I/O) interface 1004.

The data storage unit 1001 may store data which are outputted from the memory controller 1002 or may read and output the stored data to the memory controller 1002, according to a control signal generated from the memory controller 1002. The data storage unit 1001 may include the second semiconductor device 2 illustrated in FIG. 1. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1. Although FIG. 7 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. The buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically couple the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device suitable for outputting commands, a test address, addresses and a precharge signal; and
    a second semiconductor device suitable for entering an auto-precharge operation according to a combination of the commands after a read operation or a write operation and for receiving the test address and the precharge signal to perform a precharge operation of one bank selected from a plurality of banks by the addresses.

2. The semiconductor system of claim 1, wherein the second semiconductor device precharges all of the plurality of banks in response to the precharge signal if the read operation or the write operation of the selected bank terminates in the auto-precharge operation.

3. The semiconductor system of claim 1, wherein the test address is enabled to activate the auto-precharge operation.

4. The semiconductor system of claim 1, wherein the second semiconductor device includes:
    a precharge control circuit suitable for generating auto-precharge signals, one of which is selectively enabled according to a combination of bank addresses in response to a test signal and any one of a read signal and a write signal and suitable for generating internal precharge signals, one of which is selectively enabled according to a combination of flag signals in response to the precharge signal;
    a flag signal generation circuit suitable for generating the flag signals, one of which is selectively enabled according to the combination of the bank addresses in response to the read signal or the write signal if the test signal is enabled; and
    an internal circuit suitable for including the plurality of banks, one of which is selected by the bank addresses in response to the read signal or the write signal, suitable for performing the read operation or the write operation of the selected bank, and suitable for pre-charging the selected bank in response to the internal precharge signals.

5. The semiconductor system of claim 4, wherein the precharge control circuit includes:
    an auto-precharge signal generation circuit suitable for generating the auto-precharge signals, one of which is selectively enabled according to the combination of the bank addresses after a predetermined section from a point of time that the read signal or the write signal is inputted;
    a delay signal generation circuit suitable for generating delay signals, one of which is selectively enabled according to the combination of the bank addresses in response to the test signal and the precharge signal; and
    an internal precharge signal generation circuit suitable for generating the internal precharge signals, one of which is enabled if one of the auto-precharge signals is enabled or if one of the flag signals and one of the delay signals are enabled.

6. The semiconductor system of claim 5, wherein the auto-precharge signal generation circuit includes:
    a first shift register suitable for delaying the read signal, the write signal, the test signal and the bank addresses by a first delay time to generate a first read shifting signal, a first write shifting signal, a first test shifting signal and shifting addresses;
    a first logic circuit suitable for inversely buffering the first read shifting signal in response to the first test shifting signal to generate a second read shifting signal and for buffering the shifting addresses in response to the first read shifting signal to generate preaddresses;
    a second shift register suitable for delaying the first write shifting signal, the first test shifting signal and the shifting addresses by a second delay time to generate a second write shifting signal, a second test shifting signal and delay addresses;
    a second logic circuit suitable for inversely buffering the second write shifting signal in response to the second test shifting signal to generate a third write shifting signal and for outputting the preaddresses as internal addresses or buffering the delay addresses in response to the preaddresses to generate the internal addresses;
    a third shift register suitable for delaying the second read shifting signal and the third write shifting signal by a third delay time to generate a read pulse signal and a write pulse signal, for delaying the internal addresses by the third delay time in response to the second read shifting signal to generate read addresses, and for delaying the internal addresses by the third delay time in response to the third write shifting signal to generate write addresses; and
    a signal output circuit suitable for outputting the read addresses as the auto-precharge signals in synchronization with the read pulse signal and for outputting the write addresses as the auto-precharge signals in synchronization with the write pulse signal.

7. The semiconductor system of claim 6,
    wherein a delay time of the read signal for generating the read pulse signal is set to be a sum of the first delay time and the third delay time; and
    wherein a delay time of the write signal for generating the write pulse signal is set to be a sum of the first delay time, the second delay time and the third delay time.

8. The semiconductor system of claim 5, wherein the delay signal generation circuit includes:
    a drive circuit suitable for inversely buffering the precharge signal according to the combination of the bank addresses in response to the test signal to generate inverted precharge signals; and
    a delay signal output circuit suitable for generating the delay signals, one of which is selectively enabled in response to the inverted precharge signals or for generating the delay signals which are sequentially enabled in response to refresh signals that are sequentially enabled during a refresh operation.

9. The semiconductor system of claim 4, wherein the flag signal generation circuit includes:
a setting signal generation circuit suitable for generating setting signals, one of which is selectively enabled according to the combination of the bank addresses in response to the read signal, the write signal and the test signal; and
a flag signal generation circuit suitable for generating the flag signals, one of which is selectively enabled according to a combination of the auto-precharge signals if one of the setting signals is enabled and for generating the flag signals which are disabled if a reset signal and the auto-precharge signals are disabled.

10. The semiconductor system of claim 4, wherein the second semiconductor device further includes:
a read/write control circuit suitable for generating the read signal which is enabled if the read operation is executed according to a combination of the commands and for generating the write signal which is enabled if the write operation is executed according to the combination of the commands;
a test signal generation circuit suitable for generating the test signal which is enabled if the test address is inputted; and
a bank address generation circuit suitable for decoding the addresses to generate the bank addresses.

11. A semiconductor device comprising:
a precharge control circuit suitable for generating auto-precharge signals, one of which is selectively enabled according to a combination of bank addresses in an auto-precharge operation executed after a read operation or a write operation and for generating internal precharge signals, one of which is selectively enabled according to a combination of flag signals in response to a precharge signal;
a flag signal generation circuit suitable for generating the flag signals, one of which is selectively enabled according to a combination of the bank addresses if a test signal is enabled in the auto-precharge operation; and
an internal circuit suitable for including a plurality of banks and for precharging one bank selected from the plurality of banks in response to the internal precharge signals in the auto-precharge operation.

12. The semiconductor device of claim 11, wherein the test signal is enabled to activate the auto-precharge operation.

13. The semiconductor device of claim 11, wherein all of the plurality of banks are precharged in response to the precharge signal if the precharge operation of the selected bank terminates in the auto-precharge operation.

14. The semiconductor device of claim 11, wherein the precharge control circuit includes:
an auto-precharge signal generation circuit suitable for generating the auto-precharge signals, one of which is selectively enabled according to the combination of the bank addresses after a predetermined section from a point of time that a read signal or a write signal is inputted;
a delay signal generation circuit suitable for generating delay signals, one of which is selectively enabled according to the combination of the bank addresses in response to the test signal and the precharge signal; and
an internal precharge signal generation circuit suitable for generating the internal precharge signals, one of which is enabled if one of the auto-precharge signals is enabled or if one of the flag signals and one of the delay signals are enabled.

15. The semiconductor device of claim 14, wherein the auto-precharge signal generation circuit includes:
a first shift register suitable for delaying the read signal, the write signal, the test signal and the bank addresses by a first delay time to generate a first read shifting signal, a first write shifting signal, a first test shifting signal and shifting addresses;
a first logic circuit suitable for inversely buffering the first read shifting signal in response to the first test shifting signal to generate a second read shifting signal and for buffering the shifting addresses in response to the first read shifting signal to generate preaddresses;
a second shift register suitable for delaying the first write shifting signal, the first test shifting signal and the shifting addresses by a second delay time to generate a second write shifting signal, a second test shifting signal and delay addresses;
a second logic circuit suitable for inversely buffering the second write shifting signal in response to the second test shifting signal to generate a third write shifting signal and for outputting the preaddresses as internal addresses or buffering the delay addresses in response to the preaddresses to generate the internal addresses;
a third shift register suitable for delaying the second read shifting signal and the third write shifting signal by a third delay time to generate a read pulse signal and a write pulse signal, for delaying the internal addresses by the third delay time in response to the second read shifting signal to generate read addresses, and for delaying the internal addresses by the third delay time in response to the third write shifting signal to generate write addresses; and
a signal output circuit suitable for outputting the read addresses as the auto-precharge signals in synchronization with the read pulse signal and for outputting the write addresses as the auto-precharge signals in synchronization with the write pulse signal.

16. The semiconductor device of claim 15,
wherein a delay time of the read signal for generating the read pulse signal is set to be a sum of the first delay time and the third delay time; and
wherein a delay time of the write signal for generating the write pulse signal is set to be a sum of the first delay time, the second delay time and the third delay time.

17. The semiconductor device of claim 14, wherein the delay signal generation circuit includes:
a drive circuit suitable for inversely buffering the precharge signal according to the combination of the bank addresses in response to the test signal to generate inverted precharge signals; and
a delay signal output circuit suitable for generating the delay signals, one of which is selectively enabled in response to the inverted precharge signals or for generating the delay signals which are sequentially enabled in response to refresh signals that are sequentially enabled during a refresh operation.

18. The semiconductor device of claim 11, wherein the flag signal generation circuit includes:
a setting signal generation circuit suitable for generating setting signals, one of which is selectively enabled according to the combination of the bank addresses in response to a read signal, a write signal and the test signal; and a flag signal generation circuit suitable for generating the flag signals, one of which is selectively enabled according to a combination of the auto-precharge signals if one of the setting signals is enabled and for generating the flag signals which are disabled if a reset signal and the auto-precharge signals are disabled.

19. A semiconductor device comprising:

a read/write control circuit suitable for generating a read signal which is enabled if a read operation is executed according to a combination of commands and for generating a write signal which is enabled if a write operation is executed according to the combination of the commands;

a precharge control circuit suitable for generating auto-precharge signals, one of which is selectively enabled according to a combination of bank addresses in response to a test signal and any one of the read signal and the write signal and for generating internal precharge signals, one of which is selectively enabled according to a combination of flag signals in response to a precharge signal;

a flag signal generation circuit suitable for generating the flag signals, one of which is selectively enabled according to the combination of the bank addresses in response to the read signal or the write signal if the test signal is enabled; and an internal circuit suitable for including a plurality of banks, one of which is selected by the bank addresses in response to the read signal or the write signal and suitable for precharging the selected bank in response to the internal precharge signals after the read operation or the write operation of the selected bank.

20. The semiconductor device of claim 19, wherein the test signal is enabled to activate an auto-precharge operation.

21. The device of claim 19, wherein all of the plurality of banks are precharged in response to the precharge signal if a precharge operation of the selected bank terminates in an auto-precharge operation.

22. The semiconductor device of claim 19, wherein the precharge control circuit includes:

an auto-precharge signal generation circuit suitable for generating the auto-precharge signals, one of which is selectively enabled according to the combination of the bank addresses after a predetermined section from a point of time that the read signal or the write signal is inputted;

a delay signal generation circuit suitable for generating delay signals, one of which is selectively enabled in according to the combination of bank addresses in response to the test signal and the precharge signal; and an internal precharge signal generation circuit suitable for generating the internal precharge signals, one of which is enabled if one of the auto-precharge signals is enabled or if one of the flag signals and one of the delay signals are enabled.

23. The semiconductor device of claim 22, wherein the auto-precharge signal generation circuit includes:

a first shift register suitable for delaying the read signal, the write signal, the test signal and the bank addresses by a first delay time to generate a first read shifting signal, a first write shifting signal, a first test shifting signal and shifting addresses;

a first logic circuit suitable for inversely buffering the first read shifting signal in response to the first test shifting signal to generate a second read shifting signal and for buffering the shifting addresses in response to the first read shifting signal to generate preaddresses;

a second shift register suitable for delaying the first write shifting signal, the first test shifting signal and the shifting addresses by a second delay time to generate a second write shifting signal, a second test shifting signal and delay addresses;

a second logic circuit suitable for inversely buffering the second write shifting signal in response to the second test shifting signal to generate a third write shifting signal and for outputting the preaddresses as internal addresses or buffering the delay addresses in response to the preaddresses to generate the internal addresses;

a third shift register suitable for delaying the second read shifting signal and the third write shifting signal by a third delay time to generate a read pulse signal and a write pulse signal, for delaying the internal addresses by the third delay time in response to the second read shifting signal to generate read addresses, and for delaying the internal addresses by the third delay time in response to the third write shifting signal to generate write addresses; and a signal output circuit suitable for outputting the read addresses as the auto-precharge signals in synchronization with the read pulse signal and for outputting the write addresses as the auto-precharge signals in synchronization with the write pulse signal.

24. The semiconductor device of claim 23, wherein a delay time of the read signal for generating the read pulse signal is set to be a sum of the first delay time and the third delay time; and wherein a delay time of the write signal for generating the write pulse signal is set to be a sum of the first delay time, the second delay time and the third delay time.

25. The semiconductor device of claim 22, wherein the delay signal generation circuit includes:

a drive circuit suitable for inversely buffering the precharge signal according to the combination of the bank addresses in response to the test signal to generate inverted precharge signals; and a delay signal output circuit suitable for generating the delay signals, one of which is selectively enabled in response to the inverted precharge signals or for generating the delay signals which are sequentially enabled in response to refresh signals that are sequentially enabled during a refresh operation.

26. The semiconductor device of claim 19, wherein the flag signal generation circuit includes:

a setting signal generation circuit suitable for generating setting signals, one of which is selectively enabled according to the combination of the bank addresses in response to the read signal, the write signal and the test signal; and a flag signal generation circuit suitable for generating the flag signals, one of which is selectively enabled according to a combination of the auto-precharge signals if one of the setting signals is enabled and for generating the flag signals which are disabled if a reset signal and the auto-precharge signals are disabled.

* * * * *